US008859395B2

(12) United States Patent
Fratti et al.

(10) Patent No.: US 8,859,395 B2
(45) Date of Patent: Oct. 14, 2014

(54) TECHNIQUES FOR CURVATURE CONTROL IN POWER TRANSISTOR DEVICES

(75) Inventors: Roger A. Fratti, Shillington, PA (US); Warren K. Waskiewicz, Clinton, NJ (US)

(73) Assignee: Agere Systems LLC, Allentown, PA (US)

( * ) Notice: Subject to any disclaimer, the term of this patent is extended or adjusted under 35 U.S.C. 154(b) by 902 days.

(21) Appl. No.: 12/627,957

(22) Filed: Nov. 30, 2009

(65) Prior Publication Data
US 2010/0072547 A1    Mar. 25, 2010

Related U.S. Application Data

(63) Continuation of application No. 10/628,941, filed on Jul. 29, 2003, now abandoned.

(51) Int. Cl.
| | | |
|---|---|---|
| H01L 21/30 | (2006.01) | |
| H01L 21/306 | (2006.01) | |
| H01L 23/31 | (2006.01) | |
| H01L 29/66 | (2006.01) | |

(52) U.S. Cl.
CPC ... *H01L 29/66234* (2013.01); *H01L 2924/3511* (2013.01); *H01L 2924/0002* (2013.01); *H01L 21/30625* (2013.01); *H01L 23/3171* (2013.01); *H01L 29/66363* (2013.01); *H01L 2924/3011* (2013.01)
USPC .......................................... 438/459; 438/761

(58) Field of Classification Search
USPC ........... 438/459, 761, 786, 787; 257/335, 636
See application file for complete search history.

(56) References Cited

U.S. PATENT DOCUMENTS

| | | | |
|---|---|---|---|
| 5,442,223 A | 8/1995 | Fujii | |
| 5,500,312 A | 3/1996 | Harriott et al. | |
| 5,847,283 A * | 12/1998 | Finot et al. | 73/812 |
| 6,091,110 A * | 7/2000 | Hebert et al. | 257/340 |
| 6,091,121 A | 7/2000 | Oda | |
| 6,162,665 A * | 12/2000 | Zommer | 438/133 |
| 6,500,764 B1 * | 12/2002 | Pritchett | 438/690 |
| 6,531,193 B2 * | 3/2003 | Fonash et al. | 427/579 |
| 6,559,011 B1 | 5/2003 | Shibib | |
| 6,816,011 B2 * | 11/2004 | Paul et al. | 330/252 |
| 6,884,718 B2 | 4/2005 | Basceri | |

OTHER PUBLICATIONS

Syd R. Wilson, Clarence J. Tracy, and John L. Freeman, Jr., "Handbook of Multilevel Metallization for Integrated Circuits," Noyes Publ., (1993), pp. 223-225.*

Sergey Savastiouk, Oleg Siniaguine, and Martin L. Hammond, "Atmospheric Downstream Plasma," European Semiconductor, (Jun. 1998), pp. 1-4.*

(Continued)

*Primary Examiner* — Ori Nadav
(74) *Attorney, Agent, or Firm* — Ryan, Mason & Lewis, LLP

(57) ABSTRACT

Techniques for processing power transistor devices are provided. In one aspect, the curvature of a power transistor device comprising a device film formed on a substrate is controlled by thinning the substrate, the device having an overall residual stress attributable at least in part to the thinning step, and applying a stress compensation layer to a surface of the device film, the stress compensation layer having a tensile stress sufficient to counterbalance at least a portion of the overall residual stress of the device. The resultant power transistor device may be part of an integrated circuit.

10 Claims, 4 Drawing Sheets

(56) References Cited

OTHER PUBLICATIONS

Arthur Sherman, "Chemical Vapor Deposition for Microelectronics," Noyes Publ., Westwood, N.J. (1987) p. 68.*

Savastiouk et al. Atmospheric Downstream Plasma, European Semiconductor, Jun. 1998, pp. 1-4.

Sherman, Chemical Vapor Deposition for Microelectronics, Noyes Publ. Westwood, N.J. 1987, p. 68.

* cited by examiner

TECHNIQUES FOR CURVATURE CONTROL IN POWER TRANSISTOR DEVICES

CROSS-REFERENCE TO RELATED APPLICATIONS

This application is a continuation of U.S. patent application Ser. No. 10/628,941, filed Jul. 29, 2003, incorporated by reference herein.

FIELD OF THE INVENTION

The present invention relates generally to power transistor devices, and more particularly to techniques for controlling curvature in such devices.

BACKGROUND OF THE INVENTION

Metal oxide semiconductor (MOS) power transistor devices have gained popularity in certain applications for their high power capabilities. There are various types of MOS power transistor devices, including diffused metal oxide semiconductor (DMOS) devices, such as Lateral DMOS (LDMOS) devices, vertical DMOS devices and trench DMOS devices.

For proper operation of a power transistor device, e.g., a DMOS device, an appropriate amount of thermal coupling should exist between the current carrying channel and the metal heat sink upon which the device is mounted. Reflow mounting is a common process used to mount a power transistor device on a metal heat sink. During reflow mounting, the power transistor device is soldered to the metal heat sink.

Heat removal is important for proper operation of these power transistor devices. Typically, efforts are made during the processing of power transistor devices to ensure that proper thermal coupling between the device and the metal heat sink is possible so that sufficient heat removal upon mounting of the devices is attained. However, there exists a need for power transistor processing techniques that provide for improved thermal coupling and thus maximal heat removal.

SUMMARY OF THE INVENTION

The present invention provides techniques for processing power transistor devices, such as DMOS devices. In one aspect of the invention, a method for controlling curvature of a power transistor device comprising a device film formed on a substrate is provided. The method comprises the steps of thinning the substrate, the device having an overall residual stress attributable at least in part to the thinning step, and applying a stress compensation layer to a surface of the device film, the stress compensation layer having a tensile stress sufficient to counterbalance at least a portion of the overall residual stress of the device. The stress compensation layer may comprise a thin film. The method may also comprise the step of monitoring the curvature of the device.

In another aspect of the invention, a power transistor device comprises a substrate and a device film formed on the substrate, with the device having an overall residual stress attributable at least in part to a thinning process applied to the substrate. The power transistor device further comprises a stress compensation layer formed on a surface of the device film, the stress compensation layer having a tensile stress that counterbalances at least a portion of the overall residual stress of the device. The power transistor device may be part of an integrated circuit.

DETAILED DESCRIPTION

The present invention will be described below in the context of processing an exemplary power transistor device, namely a diffused metal oxide semiconductor (DMOS) device. However, it is to be understood that the present invention is not limited to use with DMOS devices. Rather, the invention is more generally applicable to the processing of any power transistor device, especially those power transistor devices requiring heat removal.

Figure 1:
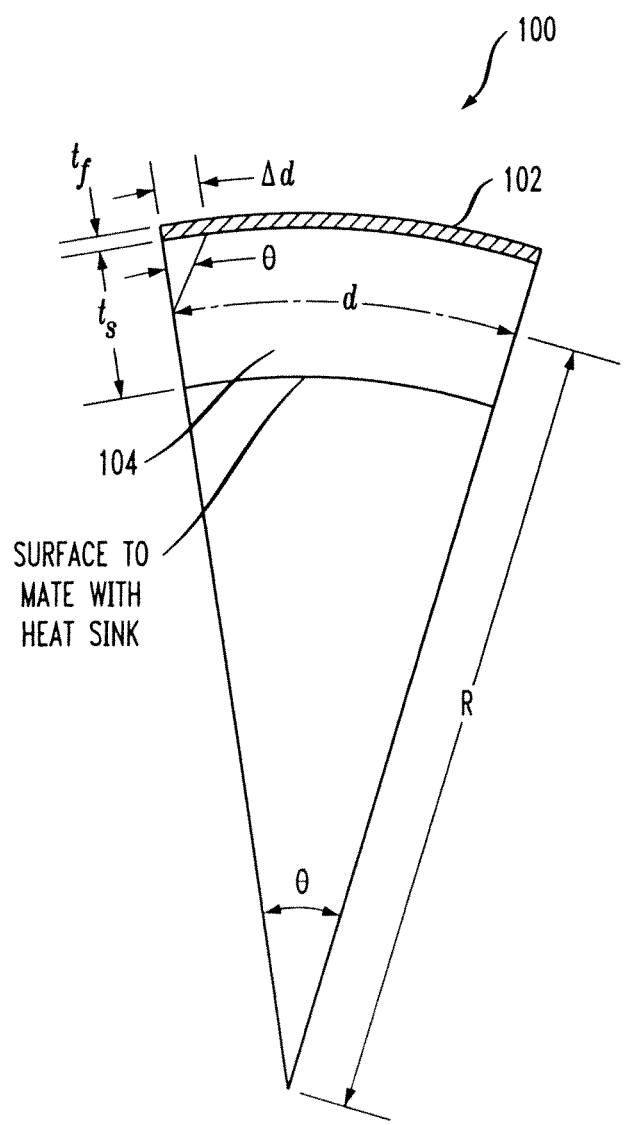
FIG. 1 illustrates an exemplary DMOS device after thinning of the device substrate has been performed.

FIG. 1 illustrates an exemplary DMOS device 100 after thinning of the device substrate has been performed. DMOS device 100 comprises DMOS device film (hereinafter "DMOS film") 102 on the surface of device substrate (hereinafter "substrate") 104. DMOS device 100 may be, for example, part of an integrated circuit. As indicated in FIG. 1, substrate 104 may be mated with a heat sink (not shown) on a side of substrate 104 opposite DMOS film 102. DMOS film 102 represents accumulated layers that comprise DMOS device 100. For example, DMOS film 102 may include a source, a gate, an insulator and a drain. To form DMOS device 100, the layers are typically deposited upon substrate 104, using well-known conventional techniques. Substrate 104 may comprise any material suitable for semiconductor device substrates, including, but not limited to, silicon.

The term "device film" as used herein is intended to include any arrangement of one or more material layers which forms at least a portion of a power transistor device.

For proper operation of a power transistor device, such as DMOS device 100, a minimal amount of thermal impedance should exist between DMOS film 102 and the metal heat sink (not shown) upon which the device is mounted. One method that may be employed to minimize thermal impedance is to reduce the thickness of substrate 104. This process is known as "thinning" the substrate.

One particular method of thinning the substrate involves aggressive backside substrate removal processing, a type of chemical-mechanical planarization (CMP) processing. Aggressive backside substrate removal processing can greatly reduce the thickness of substrate 104. In an exemplary embodiment, substrate 104, having a thickness of greater than or equal to about 750 micrometers, a typical substrate thickness, may be reduced to less than or equal to about 50 micrometers by aggressive backside substrate removal processing.

Thinning the substrate 104, e.g., by aggressive backside substrate removal processing, however, can cause voids to form in the solder employed during the reflow mounting process due to warping of DMOS device 100. Namely, when substrate 104 has been thinned, it no longer possesses a tensile stress sufficient to balance out the residual stress from DMOS film 102. As a result, warping or other type of curvature of DMOS device 100 may occur. In particular, when DMOS device 100 curves so as to be substantially concave relative to the mating surface of a heat sink (hereinafter "substantial concave curvature"), or so as to be substantially convex relative to the mating surface of a heat sink (hereinafter "substantial convex curvature"), voids may be caused to form during mounting of the device, as will be described in detail below in conjunction with the description of FIG. 3A and FIG. 3B, respectively. These voids can cause the thermal impedance of the device to increase, which may lead to device failure. Therefore, substantial concave curvature and substantial convex curvature of the device should be avoided.

In FIG. 1, aggressive backside substrate removal processing has been used to thin substrate 104, and as a result the overall residual stress of DMOS device 100 has increased. Namely, the tensile stress of substrate 104 has been reduced by the aggressive backside substrate removal processing, and as such has become insufficient to counterbalance the residual stress of DMOS film 102. This stress imbalance can cause substantial concave curvature of DMOS device 100. The concept of stress imbalance, and how stress imbalance impacts the overall residual stress of DMOS device 100 will be described in detail below.

The residual stress of DMOS film 102 that exceeds the tensile stress of substrate 104 causes substantial concave curvature of DMOS device 100, as exemplified by the radius of curvature R. The tensile stress of DMOS film 102 relative to the tensile stress of substrate 104 will be described in further detail below in conjunction with the description of FIG. 2. As the thickness $t_s$ of substrate 104 decreases relative to the thickness $t_f$ of DMOS film 102, the concave curvature of the device will increase, and R will decrease.

The substantial concave curvature of DMOS device 100 can be great enough that when attempts are made to mount DMOS device 100 on a heat sink, the wetting angle of the reflowed solder is exceeded. When the wetting angle of the reflowed solder is exceeded, thermal voids may form. The value of R can be determined, relative to $t_s$ and $t_f$, by reforming Stoney's equation regarding stress in films, $$R = \frac{1}{6} \ast Y_s \ast t_s^2 / (t_f \ast \sigma_f), \quad (1)$$

wherein R is the radius of curvature of DMOS device 100, $Y_s$, is the biaxial modulus of substrate 104, $t_s$ is the thickness of substrate 104, $t_f$ is the thickness of DMOS film 102 and $\sigma_f$ is the tensile stress of DMOS film 102.

Equation 1 indicates that R depends on $Y_s$, and $t_s$, as well as on $t_f$ and $\sigma_f$. The $Y_s$ for bulk silicon substrate is generally about 250 gigapascals (GPa). By convention, a positive $\sigma_f$ denotes a tensile stress state in which substrate 104 is curved towards DMOS film 102. In such a tensile stress state, DMOS device 100 is convex relative to the mating surface of a heat sink. Similarly, a negative $\sigma_f$ denotes a compressive stress state in which substrate 104 is curved away from DMOS film 102. In such a compressive stress state, DMOS device 100 is substantially concave relative to the mating surface of a heat sink. Tensile and compressive stress states will be described further below in conjunction with the descriptions of FIG. 3A and FIG. 3B, respectively.

It is desirable to have a DMOS device that is flat or nearly flat, relative to the mating surface of the heat sink, for proper reflow mounting. The term "nearly flat" refers to DMOS device 100 being slightly convex relative to the mating surface of the heat sink (hereinafter "slightly convex curvature"). The distinction between DMOS device 100 having a slightly convex curvature, as compared to a substantial convex curvature, focuses on whether or not the capillary action of the liquefied solder used to mount DMOS device 100 to the surface of the heat sink has been exceeded. Capillary action of the liquefied solder and void formation will be described in detail below in conjunction with the description of FIG. 3A.

By placing a tensile stress on a surface of DMOS device 100, namely a surface of DMOS device 100 opposite substrate 104, the curvature may be changed or maintained and a flat, or a slightly convex curvature, may be achieved. The tensile stress may be provided by applying a thin film on a surface of DMOS device 100 opposite substrate 104 and over DMOS film 102. The application of a thin film to the surface of DMOS device 100 will be described in detail below in conjunction with the description of FIG. 4. Again addressing Stoney's equation regarding film stress, as in Equation 1 above, the thin film providing a tensile stress would possess a tensile stress $\sigma_{f2}$ and a thickness $t_{f2}$. The thin film values, $\sigma_{f2}$ and $t_{f2}$, may be expressed, relative to the values for DMOS film 102 and substrate 104, as follows, $$R_t = \frac{1}{6} \ast Y_s \ast t_s^2 / [(t_f \ast \sigma_f) + (t_{f2} \ast \sigma_{f2})]. \quad (2)$$

As is shown in Equation 2, the radius of curvature $R_t$ of DMOS device 100 with the applied thin film is now presented as being proportional to the tensile stress and thickness of the thin film.

Figure 2:
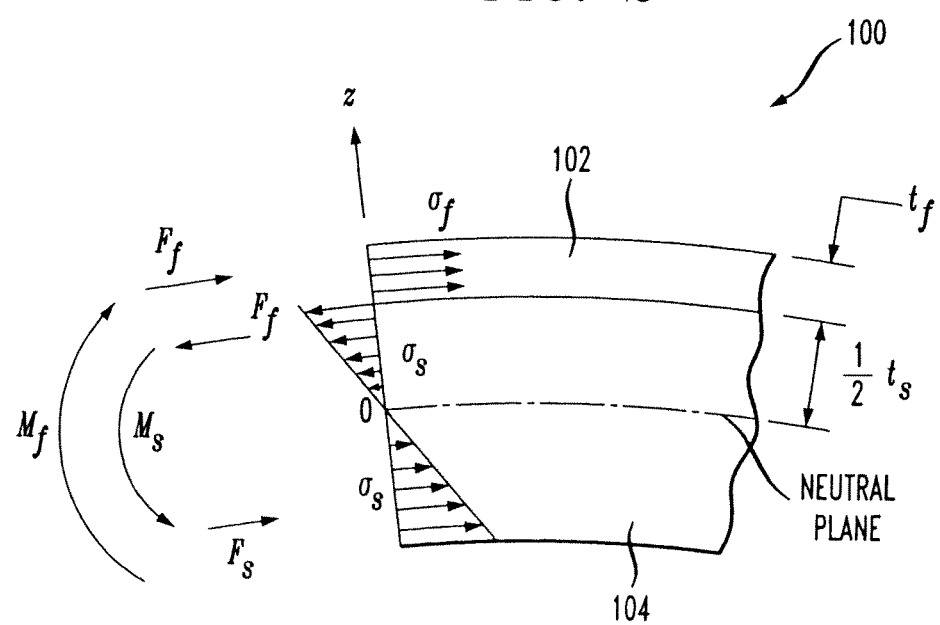
FIG. 2 illustrates stress state conventions in a DMOS device.

FIG. 2 illustrates stress state conventions in DMOS device 100. As was mentioned above in conjunction with the description of FIG. 1, FIG. 2 shows the tensile stress $\sigma_f$ of DMOS film 102, relative to the tensile stress $\sigma_s$ of substrate 104. The tensile stress $\sigma_s$ is shown to pivot about a neutral plane of substrate 104. As such, the force $F_f$ of DMOS film 102, and the force $F_s$ of substrate 104, cause opposite moments $M_f$ and $M_s$ for DMOS film 102 and substrate 104, respectively. Opposite moments $M_f$ and $M_s$ may result in thermal void formation upon mounting of DMOS device 100 on a heat sink, as is described in detail below, in conjunction with the description of FIG. 3A and FIG. 3B.

Figure 3A:
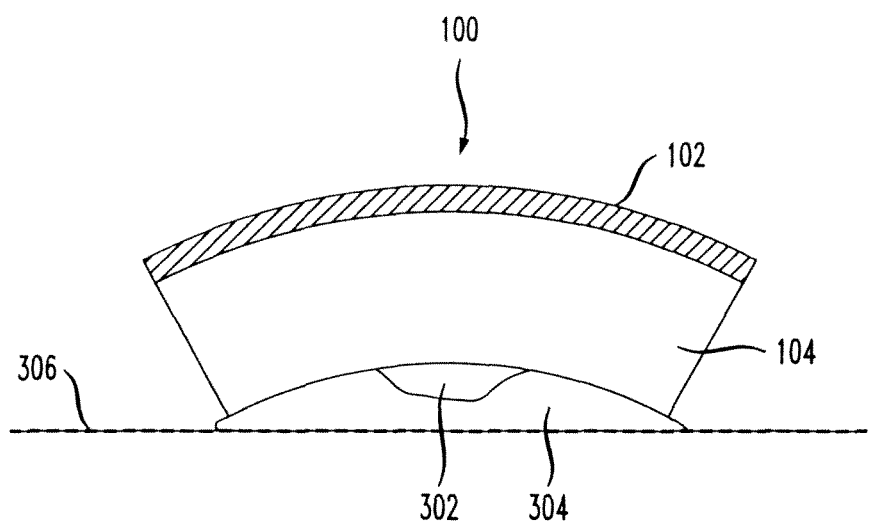
FIG. 3A illustrates a thermal void resulting from compressive stress in a DMOS device after aggressive backside substrate removal processing.

FIG. 3A illustrates a thermal void resulting from compressive stress in DMOS device 100 after aggressive backside substrate removal processing. As is shown in FIG. 3A, a compressive stress state has rendered DMOS device 100, namely DMOS film 102 and substrate 104, substantially concave relative to the mating surface of heat sink 306. Such a compressive state results when the tensile stress $\sigma_f$ of DMOS film 102 (FIG. 2) is less than zero. DMOS device 100 is attached to heat sink 306 using reflow solder mounting. In reflow solder mounting, DMOS device 100 is attached to heat sink 306 using solder 304 at the points indicated in FIG. 3A. However, when DMOS device 100 has a substantial concave curvature, voids, e.g., void 302, may be formed. Void 302 acts as a thermal void and results in improper thermal mating between DMOS device 100 and heat sink 306. DMOS devices that have a substantial concave curvature may fail via blistering, delamination or other failure condition.

Void 302 formation occurs when the capillary action of liquefied solder 304 can no longer overcome the height of the gap left by the bowing of DMOS device 100 away from heat sink 306. That is, the weight of the volume of solder 304 exerts a downward force, $$F_d = \frac{1}{4} \ast \rho g \pi d^2 h \quad (3)$$

that exceeds the upward force, $$F_u = \pi d \gamma_L \cos(\Phi) \quad (4)$$

due to the surface tension of the liquid. Here, $\rho$ is the density of liquefied solder 304, g is gravity (9.7805 meters per second per second (m/sec$^2$)), d is the diameter of DMOS device 100, h is the height (or sag) of the warped surface above the flat level, $\gamma_L$ and $\Phi$ are the surface tension and the wetting angle of liquefied solder 304, respectively. Combining these equations and solving for h yields, $$h = 4\gamma_L \cos(\Phi)/\rho g d. \tag{5}$$

The radius of curvature R relates to h and d as such, $$R = d^2/h. \tag{6}$$

As an illustrative example, a conventional gold-tin (Au—Sn) solder material for a DMOS packaging process could typically have a density at the reflow temperature of seven grams per square centimeter (g/cm$^2$), a surface tension of 350 milliNewtons per meter (mN/m) and a wetting angle of up to 50 degrees. For the mounting of an entire standard eight inch diameter wafer substrate, voids could form when the height h exceeds approximately 65 microns, or a radius of curvature of approximately 638 meters. Individual DMOS devices (possibly as large as 0.5 millimeters×1.5 millimeters), cut out from such a wafer, would exhibit the same R as the entire wafer.

Adjusting solder-related parameters such as density, surface tension, and wetting angle, relative to the solder, is a classical method of attacking the warping problem. For example, a more favorable wetting angle of only 25 degrees would allow h to exceed 91 microns (eight inch wafer substrate) before void formation would occur in the same system as above. However, modification of these solder-related properties can occur over only a limited range and does not solve the inherent problem of the substrate warping. Additionally, adjustment of these solder-related parameters may yield undesirable results relating to other solder properties, such as mechanical failure limits and thermal conductivity.

Figure 3B:
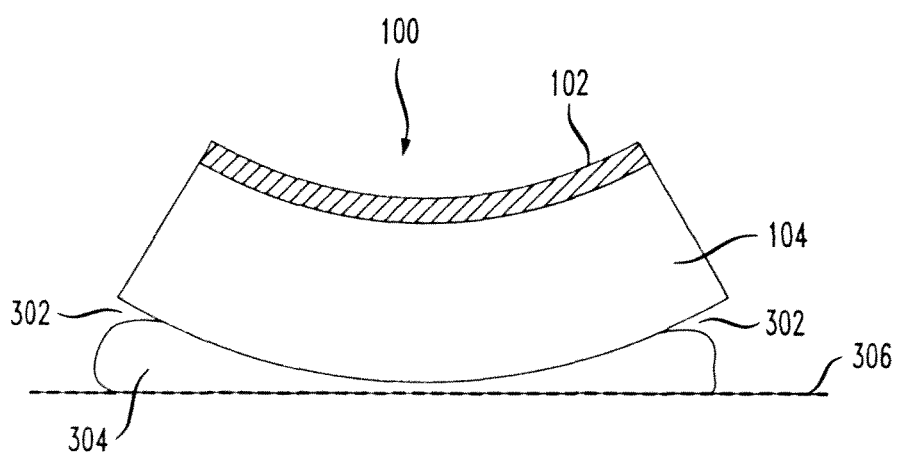
FIG. 3B illustrates thermal voids resulting from excessive tensile stress in a DMOS device.

FIG. 3B illustrates thermal voids resulting from excessive tensile stress in DMOS device 100. As is shown in FIG. 3B, excessive tensile stress has resulted in DMOS device 100 having a substantial convex curvature. In general, a convex curvature of DMOS device 100 occurs when the tensile stress $\sigma_f$ of DMOS film 102 (FIG. 2) is greater than zero. As was mentioned above, in conjunction with the description of FIG. 1, a slightly convex curvature is desirable. However, when $\sigma_f$ is great enough to cause a substantial convex curvature, voids, e.g., voids 302, may be formed. In reference to Equation 5 above, h must not exceed the capillary action of liquefied solder 304. As exemplified above, for an Au—Sn solder having a density of seven g/cm$^2$, a surface tension of 350 mN/m and a wetting angle of up to 50 degrees, h should not exceed 65 microns, in order to prevent void formation.

As also described above, voids 302 act as thermal voids resulting in improper thermal mating between DMOS device 100 and heat sink 306. DMOS devices that have substantial convex curvature may fail via cracking or other failure condition. Thus, the curvature of DMOS device 100 should be controlled, e.g., changed or maintained, to be, at most, slightly convex. As will be described below in conjunction with the description of FIG. 4, the curvature of DMOS device 100 may be changed to attain a desired curvature.

Figure 4:
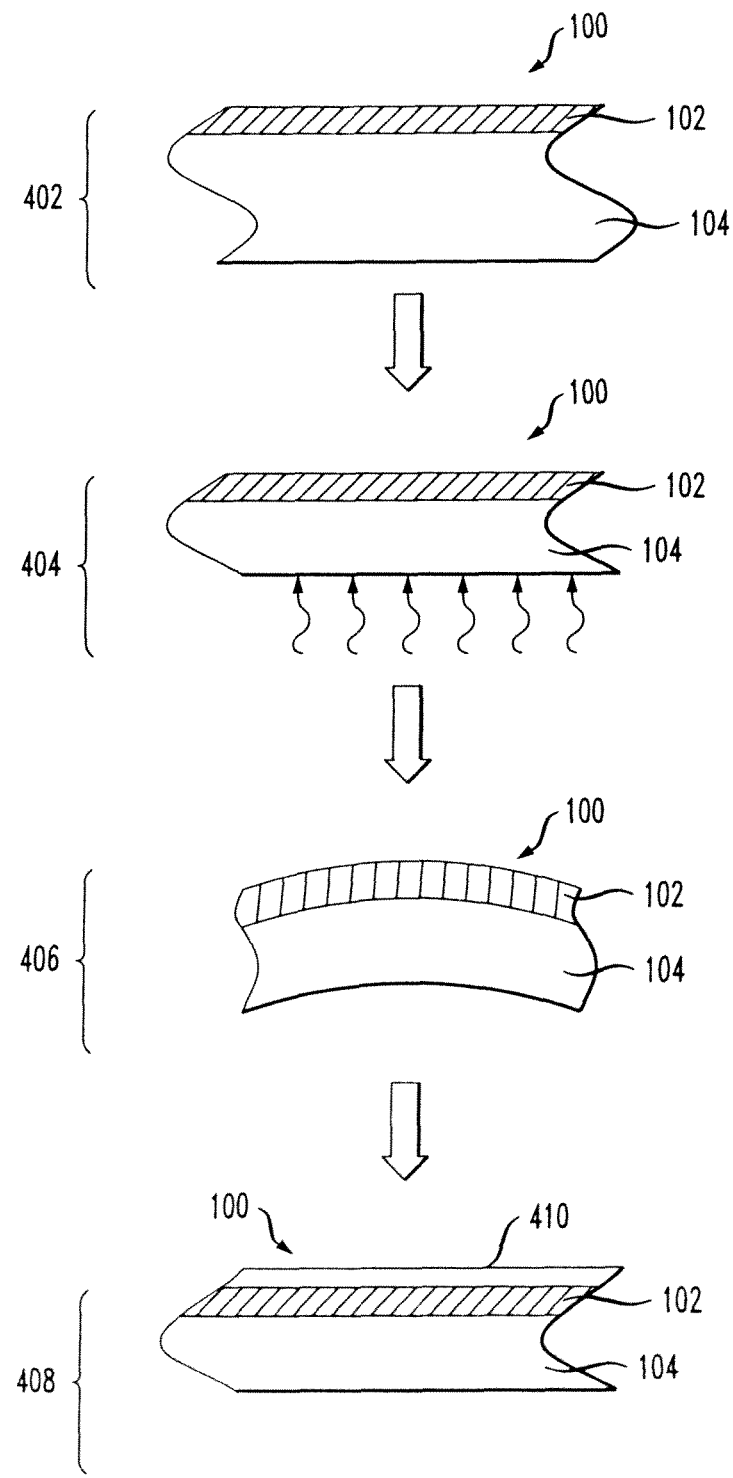
FIG. 4 is a diagram of an exemplary technique for controlling curvature of a DMOS device.

FIG. 4 is a diagram of an exemplary technique for controlling curvature of DMOS device 100. As is shown in step 402, DMOS device 100 comprises DMOS film 102 and substrate 104. In step 404, aggressive backside substrate removal processing is used to thin substrate 104. Reducing the thickness of substrate 104 reduces the tensile stress of substrate 104 relative to DMOS film 102, and, as is shown in step 406, DMOS device 100 curves. The curving shown in step 406 would provide DMOS device 100 with a substantial concave curvature. As was described in conjunction with the description of FIG. 3A, a DMOS device that has a substantial concave curvature is a result of the tensile stress $\sigma_f$ of DMOS film 102 being less than zero.

The stress of DMOS film 102 less the stress of substrate 104, that dictates the curvature of DMOS device 100, represents an overall stress in DMOS device 100. Thus, after aggressive backside substrate removal processing, the overall residual stress of DMOS device 100 is a compressive stress that provides DMOS device 100 with a substantial concave curvature. This overall residual stress must be counterbalanced, at least in part, to reverse, substantially eliminate, or prevent further curvature of DMOS device 100. As such, the more of substrate 104 that is removed during aggressive backside substrate removal processing, the greater the overall residual stress of DMOS device 100.

As is shown in step 408 of FIG. 4, thin film 410 may be applied to the surface of DMOS device 100 over DMOS film 102 and opposite substrate 104. Thin film 410 has a tensile stress that counterbalances at least a portion of the overall residual stress of DMOS device 100 and renders DMOS device 100 flat, or slightly convex (not shown). When the tensile stress of thin film 410 is greater than the overall residual stress of DMOS device 100, the curvature of DMOS device 100 may be reversed.

Thin film 410 is an example of what is more generally referred to herein as a "stress compensation layer." The term "stress compensation layer" as used herein is intended to include one or more thin films or other material layers applied to a device film in order to counterbalance at least a portion of an overall residual stress of a device.

Thin film 410 may comprise any material or combination of materials that do not react adversely with the components of DMOS device 100 or any packaging materials DMOS device 100, specifically thin film 410, may come in contact with. Suitable materials include dielectric materials, including, but not limited to, silicon nitrides, silicon oxides, silicon oxynitrides, oxynitrides, nitrides and combinations comprising at least one of the foregoing dielectric materials. Thin film 410 may be deposited on DMOS device 100 using any appropriate conventional deposition techniques used for depositing thin films. Suitable deposition techniques include, but are not limited to, sputtering, chemical vapor deposition, electroplating and spin-on processing.

The thickness of thin film 410 may be determined according to Equation 2, above. Namely, the thin film thickness $t_{f2}$ and tensile stress impact the radius of curvature R. In an exemplary embodiment, a 3-level metal Lateral DMOS (LDMOS) device (with DMOS film thickness equal to ten microns) involves backside CMP removal of 50 microns of the silicon substrate, prior to die dicing and subsequent packaging, to meet thermal design requirements. A process specification of a full six inch wafer (original substrate thickness equals 500 microns) at a radius of curvature R of greater than 600 meters following this CMP step is set to prevent void formation in the subsequent solder reflow packaging steps. The fabrication process that meets the device electrical performance specifications has an 80 percent yield following the CMP step, with R equal to 500 meters in 95 percent of the non-conforming product. Assuming that the substrates are flat prior to the CMP step, this would indicate that the failing wafers have a residual device film stress $\sigma_f$ equal to −1.7 megapascals (MPa). A thin film stress compensation layer, with $\sigma_{f2}$ equal to 10 MPa, is deposited on top of the finished wafer to increase the die yield. According to the following equation, $$t_{f2} = ((Y_s t_s^2/6*R) - (t_f \sigma_f))/\sigma_{f2} \tag{7}$$

the thin film thickness required is then 294 nanometers.

For the same DMOS process described above, it may be desirable to be able to "tune" the final substrate thickness to achieve a range of thermal transfer characteristics for an end user. On a per wafer level, a process can be established whereby the substrate thickness desired can be set after the device lot is finished, as demanded by the thermal performance specifications. That is, the thickness of the stress compensation layer can be determined using Equation 7, above, on a per wafer level depending on what the exact substrate thickness.

Thin film 410 may be deposited as a separate layer on DMOS device 100, as is shown in step 408 of FIG. 4. DMOS devices, however, typically include an encapsulating layer. The encapsulating layer serves as an outer protective layer of DMOS device 100. While it is understood that, according to the present invention, thin film 410 may be applied as the outer-most layer of DMOS device 100, i.e., over an encapsulating layer, thin film 410 may also provide the functionality of an encapsulating layer and thus also serve as an encapsulant. In such an embodiment, thin film 410 would replace an encapsulating layer.

The steps of FIG. 4 may be performed repeatedly and, in particular to steps 404 through 408, in any order, until a desired curvature of DMOS device 100 is attained. For example, in an exemplary iterative process, either one of aggressive backside substrate removal processing or application of thin film 410 may be performed first. In the instance wherein aggressive backside substrate removal processing is first performed, thin film 410 may then be applied to flatten, or to make slightly convex, DMOS device 100. Aggressive backside substrate removal processing may then again be performed, followed by the application of additional thin film 410, and so on. This exemplary iterative process ensures that DMOS device 100 does not experience extreme curvature at any one step.

The processing steps outlined in FIG. 4 may be performed on individual DMOS devices. The steps may also be performed on a wafer containing repeated patterns to be subsequently divided up into individual DMOS devices. Thus, in an exemplary embodiment, the curvature of a wafer is controlled according to the steps of FIG. 4 and then the wafer is divided into individual DMOS devices. Alternatively, in another exemplary embodiment, the steps of FIG. 4 may be used to alter the curvature of single individual DMOS devices relative to other DMOS devices, e.g., to correct variations in individual units, and uniformly attain the desired curvature.

The curvature of DMOS device 100 may be monitored. One exemplary technique for monitoring the curvature of DMOS device 100 is through the use of off-axis optical laser techniques. In off-axis optical laser techniques, the direction of reflection is sensitive to the radius of curvature R of DMOS device 100. The steps of, e.g., FIG. 4, may be performed to change the curvature of DMOS device 100. As such, off-axis laser techniques may be used to monitor curvature change. Further, off-axis laser techniques may be used while changing the curvature of DMOS device 100 to signal when DMOS device 100 has attained a desired curvature. It is to be understood that the term "desired curvature" is intended to include flat, or slightly convex, configurations, as well as other desired configurations.

Although illustrative embodiments of the present invention have been described herein, it is to be understood that the invention is not limited to those precise embodiments, and that various other changes and modifications may be made by one skilled in the art without departing from the scope or spirit of the invention.

What is claimed is:

1. A method for controlling curvature of a power transistor device comprising a device film formed on a substrate, the method comprising the steps of:
    thinning the substrate, the power transistor device having an overall residual stress attributable at least in part to the thinning step;
    applying a stress compensation layer to a surface of the device film, the stress compensation layer having a tensile stress sufficient to counterbalance at least a portion of the overall residual stress of the power transistor device and to configure a curvature of the power transistor device to be between flat and slightly convex; and
    monitoring the curvature of the power transistor device, wherein the curvature of the power transistor device is monitored using an off-axis optical laser technique.

2. The method of claim 1, wherein the stress compensation layer comprises a thin film.

3. The method of claim 1, wherein the power transistor comprises a DMOS device.

4. The method of claim 1, wherein the power transistor device substrate is thinned using aggressive backside substrate removal processing.

5. The method of claim 2, wherein the thin film comprises a dielectric material comprising at least one of a silicon nitride, a silicon oxide, a silicon oxynitride, an oxynitride, a nitride and combinations comprising at least one of the foregoing dielectric materials.

6. The method of claim 2, wherein the thin film is applied using a deposition technique comprising at least one of sputtering, chemical vapor deposition, electroplating and spin-on processing.

7. The method of claim 1, wherein the steps of thinning and applying are performed repeatedly until a desired curvature is attained.

8. The method of claim 2, wherein the thin film serves as an encapsulating layer.

9. The method of claim 1, wherein the stress compensation layer applied to the surface of the power transistor device changes the curvature of the power transistor device.

10. The method of claim 1, wherein the stress compensation layer applied to the surface of the power transistor device maintains the curvature of the power transistor device.

* * * * *